United States Patent
Kushnir et al.

(10) Patent No.: US 8,121,571 B2
(45) Date of Patent: Feb. 21, 2012

(54) METHOD FOR SECOND INTERCEPT POINT CALIBRATION BASED ON OPPORTUNISTIC RECEPTION

(76) Inventors: Igal Kushnir, Azor (IL); Ofir Degani, Haifa (IL); Lior Kravitz, Kfar Bilu (IL); Alexander Rivkind, Haifa (IL)

( * ) Notice: Subject to any disclaimer, the term of this patent is extended or adjusted under 35 U.S.C. 154(b) by 241 days.

(21) Appl. No.: 12/653,834

(22) Filed: Dec. 18, 2009

(65) Prior Publication Data

US 2011/0151792 A1  Jun. 23, 2011

(51) Int. Cl.
*H04B 17/00* (2006.01)
(52) U.S. Cl. ............... 455/226.1; 455/224; 455/284; 455/63.1; 455/313; 455/283; 375/346; 375/224
(58) Field of Classification Search .......... 455/226.1, 455/224, 63.1, 313, 283, 284; 375/346, 224
See application file for complete search history.

(56) References Cited

U.S. PATENT DOCUMENTS

| | | | |
|---|---|---|---|
| 7,203,472 B2 * | 4/2007 | Seppinen et al. | 455/226.1 |
| 8,010,074 B2 * | 8/2011 | Kaczman et al. | 455/313 |
| 2009/0202022 A1 * | 8/2009 | Kaczman et al. | 375/319 |
| 2010/0093298 A1 * | 4/2010 | Pratt et al. | 455/226.1 |

* cited by examiner

*Primary Examiner* — Sanh Phu
(74) *Attorney, Agent, or Firm* — Forefront IP Lawgroup, PLLC (57) ABSTRACT

A transceiver device that performs an intercept point calibration using signal interferers is described. The signal interferers include at least self-generated signal interferers or opportunistic signal interferers in surrounding areas. Due to non-linearity in the transceiver device, intermodulation distortion (IMD) signal components are generated. Filtering of the IMD signal components is performed to allow low-frequency components, such as a second order intermodulation (IM2) to pass through. A dynamic minimization algorithm is performed to minimize distortion effects of the low-frequency components.

20 Claims, 6 Drawing Sheets

METHOD FOR SECOND INTERCEPT POINT CALIBRATION BASED ON OPPORTUNISTIC RECEPTION

BACKGROUND

Intermodulation distortion (IMD) can wreak havoc in modern wireless-communication systems. System designers strive to reduce the IMD, for example, through improved linearity of a system. The linearity of the system can govern how much IMD will occur within the system, which in turn can create interference. Through improved linearity of system building blocks, an overall susceptibility of the system to the IMD can be decreased.

IMD can occur as two or more signals pass through a two-port network device with a nonlinear transfer function. An output spectrum for the two-port network device can include original signals and additional spurious signals. The additional spurious signals can create and/or cause an interference within the two-port network device (i.e., original system), or in other systems. When the spurious signals are of sufficient amplitude, the interference that can result can overpower signal of interest, such as loss of transmitted information (e.g., voice, data, or video). The undesirable effects of IMD can be mitigated, by improving the linearity of system components (amplifiers, other semiconductors, and even passive elements) through proper calibration.

SUMMARY

The following presents a simplified summary in order to provide a basic understanding of some aspects of the disclosed subject matter. This summary is not an extensive overview of the disclosed subject matter, and is not intended to identify key/critical elements or to delineate the scope of such subject matter. A purpose of the summary is to present some concepts in a simplified form as a prelude to the more detailed description that is presented later.

In an implementation, an intercept point calibration can be performed in a transceiver device. The intercept point calibration can be used to provide linearity in the transceiver device. The intercept point calibration can use signal interferers, such as self-generated signal interferers or opportunistic (i.e., existing) signal interferers in surrounding areas (i.e., on the air). For example, the opportunistic signal interferers can be received by the transceiver device, and low pass filtering can be performed to allow low-frequency components of the opportunistic signal interferers to pass through. A power level measurement of the low-frequency components is performed, and the power level measurement can be used as a reference for implementing a dynamic minimization algorithm. The dynamic minimization algorithm can be used to provide the linearity in the receiver device.

To the accomplishment of the foregoing and related ends, certain illustrative aspects are described herein in connection with the following description and the annexed drawings. These aspects are indicative of various ways in which the disclosed subject matter can be practiced, all of which are intended to be within the scope of the disclosed subject matter. Other advantages and novel features can become apparent from the following detailed description when considered in conjunction with the drawings.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Overview

In a transceiver device (i.e., wireless communications system) that includes a transmitter component and a receiver component, an intercept point calibration (procedure) can be performed to maintain or obtain linearity of operation. The linearity of operation includes minimal distortions during the operation of the transceiver device. In an implementation, the intercept point calibration can be focused upon a second order intercept point (IP2), which is a parameter used to characterize the linearity in the transceiver device. This intercept point calibration can be referred to as a second order intercept point or IP2 calibration.

The intercept point calibration can use signal interferers, such as self-generated signal interferers (e.g., leaking signals during transmission) or opportunistic signal interferers in surrounding areas (e.g., Bluetooth). The signal interferers can be received by the transceiver device, and because of non-linearity in the transceiver device, IMD signal components can be produced. The IMD signal components are unwanted signals that include a second order intermodulation distortion (IM2), a third order intermodulation distortion (IM3), and other harmonic signals at higher frequencies (i.e., IM4, IM5, etc.). To obtain the linearity of operation in the transceiver device, the intercept point calibration can be performed to minimize distortion effects of the IMD signal components.

Architecture Implementations

Figure 1:
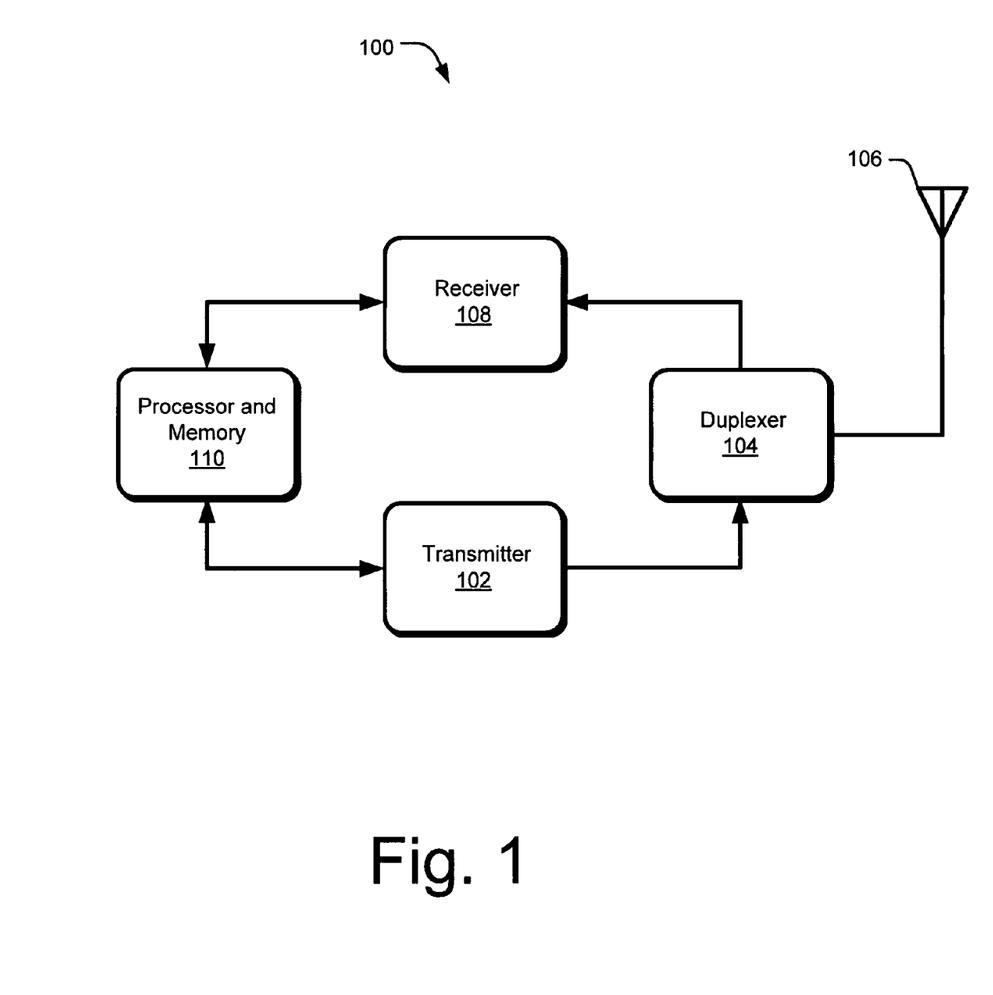
FIG. 1 is a block diagram of an exemplary transceiver.

FIG. 1 illustrates an exemplary architecture of a transceiver device 100. The transceiver device 100 can be used in a wireless communications system where information (i.e., baseband signal) is transmitted and/or received through RF signals. The transceiver device 100, which can be an IC chip, can include a transmitter component 102, a duplexer component 104, an antenna 106, a receiver component 108 and a processor/memory component 110. In an implementation, the transmitter component 102 includes different blocks (not shown) for mapping the baseband signal. The baseband signal is used to modulate frequency carrier signals. The baseband signal can modulate the frequency carrier signals through different types of modulation techniques as known in the art. The different types of modulation techniques can correspond to bandwidth requirements, spectrum efficiency, and specific design of the receiver component 108.

After the baseband signal has modulated the frequency carrier signal in the transmitter component 102, a modulated RF signal is transmitted via the duplexer component 104, and through the antenna 106. In an implementation, the duplexer component 104 can be a device that allows bi-directional communication over a single channel. In the wireless communications system, the duplexer component 104 can provide isolation between the transmitter component 102 and the receiver component 108. The isolation can include high attenuation level in order to prevent the receiver component 108 from desensitization (i.e., unable to fully receive a desired signal). In certain implementations, the duplexer component 104 provides adequate rejection of noise (i.e., leakage) during transmission, which can occur at receive frequency of the receiver component 108.

The receiver component 108 can include different subcomponents (not shown) in receiving the modulated RF signals induced in the antenna 106. The modulated RF signals can be demodulated to obtain the baseband signals. In an implementation, the receiver component 108 can be a direct conversion receiver. The direct conversion receiver is widely used in wireless communications system, because of a high integration level (e.g., two dies in one chip) and low production cost; however, the direct conversion receiver can be prone to a non-linearity that produces IM2. The IM2 can include a voltage offset (i.e., DC offset) and unwanted signals at certain frequencies (e.g., near baseband frequencies). The voltage offset includes a component of the IM2 independent of frequencies (i.e., frequency invariant) while the unwanted signals at certain frequencies include a component of the IM2 generated around the voltage offset or the baseband frequencies. In other implementations, the IM3 creates lesser distortion effects because the IM3 includes unwanted signals at frequencies higher than the baseband frequencies.

In an implementation, the IM2 can become a serious impairment in the receiver component 108 because the IM2 will land on a desired channel, which desensitizes the receiver component 108. The desensitization of the receiver component 108 can provide low signal to noise ratio measurement of the desired channel because of a co-channel interference generated by the IM2. As further discussed below, an intercept point calibration can be performed to obtain a relatively high IP2. The relatively high IP2 denotes linearity in the receiver component 108.

In an implementation, the processor/memory component 110 includes one or more computer readable memory or storage devices (not shown) with computer readable instructions. The processor/memory component 110 can store program codes, such as modulation techniques to be used, dynamic minimization algorithms to be performed and/or executed, and the like. The one or more computer readable memory or storage devices can be coupled to one or more processors that execute the program codes. For example, the processor/memory component 110 can activate or enable a calibration mode for the transceiver device 100.

In an implementation, the calibration mode includes a process of correcting the non-linearity in the receiver component 108. The calibration mode can be activated when the signal interferers, such as the opportunistic signal interferers are sensed and/or monitored from surrounding areas and/or other systems. The opportunistic signal interferers can include existing signals from the air, such as signals generated by Bluetooth, WiFi, and the like. In certain implementations, the calibration mode can be activated when the signal interferers, such as the self-generated signal interferers are sensed and/or monitored from within the transceiver device 100. The self-generated signal interferers can include leaking signal interferers from the transmitter component 102 and/or other channels in the transceiver device 100. In other implementations, the calibration mode can be enabled and activated at pre-configured time intervals. When the calibration mode is enabled, the transceiver device 100 can be configured to reject desired signals at receiver frequency signal path of the receiver component 108; however, the signal interferers can be received and used for the intercept point calibration. The desired signals can include the RF signals that contain the information as described above.

Figure 2:
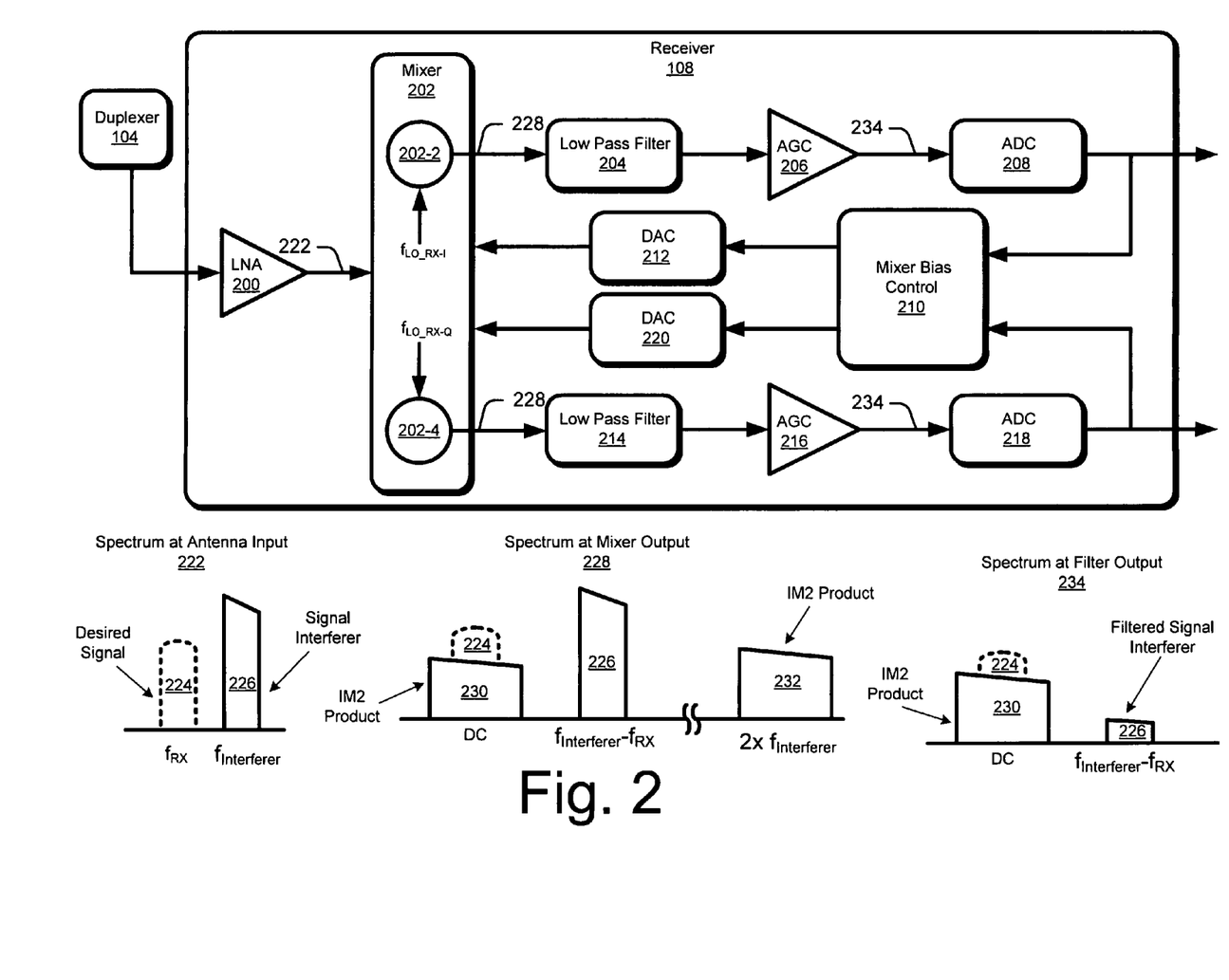
FIG. 2 is a block diagram of an exemplary receiver component in a transceiver.

FIG. 2 is an exemplary implementation of a receiver component 108. The receiver component 108 can include a low noise amplifier (LNA) 200, a mixer component 202, a low pass filter component 204 for in-phase channel (I), an automatic gain control amplifier (AGC) component 206, an analog to digital converter (ADC) component 208 for the I channel, a mixer bias control component 210, a digital to analog converter (DAC) component 212 for the I channel, a low pass filter component 214 for quadrature phase channel (Q), an AGC component 216 for the Q channel, an ADC component 218 for the Q channel, and a DAC component 220 for the Q channel.

As discussed above, the receiver component 108 can be configured to reject the desired signals when the calibration mode is activated or enabled. When the calibration mode is activated, the signal interferers (i.e., opportunistic or self-generated) can be used to calibrate the receiver component 108 to obtain the linearity of operations. For example, the self-generated signal interferers can be generated by the transmitter component 102. Transmitted signals from the transmitter component 102 can be attenuated via the duplexer component 104; however, portions of the transmitted signals can still leak into a receiver signal path (e.g., through the LNA 200). The transmitted signals that leak into the receiver signal path can be received by the mixer component 202. Due to the non-linearity in the mixer component 202, the IMD signal components, such as the IM2 can be produced.

In an implementation, during the calibration mode (or process), the mixer component 202 separately processes the I channel and the Q channel of the signal interferers (e.g., self-generated signal interferers). The mixer component 202 includes a mixer component 202-2 for the I channel and a mixer component 202-4 for the Q channel. The mixer components 202-2 and 202-4 are separately calibrated to obtain the linearity of operations, because the IM2 produced by the mixer component 202-2 is separate and distinct from the IM2 produced by the mixer component 202-4.

In an implementation, a local oscillator frequency (i.e., $f_{LO\_RX\text{-}I}$ for the I channel) for the mixer component 202-2 is multiplied or mixed with the I channel (input frequency) of the signal interferers. Due to the non-linearity in the mixer component 202-2, IMD signal components are produced in addition to a desired output. For example, the desired output includes the signal interferers multiplied by a certain gain constant (i.e., gain constant of the mixer component 202-2). The IMD signal components can include the IM2, the IM3 and other unwanted harmonic signals at higher frequencies; however, for the direct conversion receiver, the intercept point calibration is applied to low-frequency components, such as the IM2. The IM2 can revolve around the base band frequencies and can cause significant distortions than the IM3, which can occur at higher frequencies than the baseband frequencies. In certain implementations, the IM2 for the I channel can contain the voltage offset (which is independent of $f_{LO\_RX\text{-}I}$ and the I channel input frequency) and the unwanted signals at higher frequencies (e.g., twice of signal interferer frequencies). The voltage offset can be measured with high signal to noise ratio because of absence of the desired signals during the calibration mode.

In an implementation, the low pass filter component 204 filters the unwanted signals at high frequency components (e.g., twice signal interferer frequency) and allows low-frequency components (e.g., IM2) of the IMD signal components to pass through. The low-frequency components can be received by the AGC 206, which can be used to amplify the low-frequency components. In certain implementation, an output of the AGC 206 includes a filtered desired output. The amplified low-frequency components can be coupled and/or received by the ADC component 208. A digital output of the ADC component 208 is further coupled to the mixer bias control component 210.

The mixer bias control component 210 can be configured to perform a dynamic minimization algorithm to minimize distortion effects of the low-frequency components (e.g., IM2). The dynamic minimization algorithm includes an algorithm that provides or computes setting adjustments (e.g., bias setting adjustments) to compensate for the non-linearity in the mixer component 202-2. In an implementation, the dynamic minimization algorithm increases the IP2, which is a gauge of linearity in the mixer component 202-2. In other implementations, the mixer bias control component 210 includes a monitoring or an estimator circuit for power level measurement of the low-frequency components (e.g., power level of the voltage offset in the IM2). The power level measurement can be used as a reference to dynamically tune up (i.e., intercept point calibrate) the mixer component 202-2.

In an implementation, an output of the mixer bias control component 210 is received by the DAC component 212. The DAC component 212 can be configured to convert the setting adjustments into an optimized analog setting for the mixer component 202-2. The optimized setting of the mixer component 202-2 controls an operating parameter of the mixer component 202-2. For example, the operating parameter of the mixer component 202-2 includes differential current outputs (e.g., I+ and I−) that contains mismatches due to the non-linearity in the mixer component 202-2.

With regard to the Q channel of the signal interferers used in the intercept point calibration, the procedure as discussed above for the I channel can be applied. In particular, a local oscillator frequency (e.g., $f_{LO\_RX\_Q}$) for the mixer component 202-4 is multiplied or mixed with Q channel input frequency of the signal interferers. Due to non-linearity in the mixer component 202-4, the IMD signal components are produced in addition to the desired output. In an implementation, the low pass filter component 214 can be used to provide the low-frequency components (e.g., IM2) of the IMD signal components for the Q channel. The low-frequency components can include the IM2, which can be measured by an estimator circuit at the mixer bias control component 210. The estimator circuit can detect the power level of the IM2 with high signal to noise ratio for accurate measurements. The power level of the IM2 for the Q channel can be used as the reference for the dynamic minimization algorithm.

In an implementation, the power level for the IM2 in the Q channel can be suppressed by applying the setting adjustments provided by the dynamic minimization algorithm. The setting adjustments can include bias adjustments implemented by the DAC component 220 to control an operating parameter of the mixer component 202-4. For example, setting adjustments can be converted by the DAC component 220 into an optimized analog setting for the mixer component 202-4. In other implementations, the operating parameter of the mixer component 202-4 can be controlled by the setting adjustment (e.g., bias adjustments) that corresponds to different step amount in the DAC component 220.

In certain implementations, the procedure discussed above regarding the self-generated signal interferers can be applied and/or observed when the opportunistic signal interferers in the surrounding areas are used in the intercept point calibration. In particular, the non-linearities in the receiver component 108 can provide the IMD signal components at the output of the mixer component 202. The I channel and the Q channel for the opportunistic signal interferers are processed separately to obtain a sufficiently high IP2. The sufficiently high IP2 can be obtained by the setting adjustments provided by the mixer bias control component 210. The setting adjustments can be converted by the DAC component 212 and the DAC component 220 into the optimized analog setting of the mixer components 202-2 and 202-4 respectively.

As further shown in FIG. 2, exemplary signal components are illustrated to further clarify the intercept point calibration. A spectrum at antenna input 222 includes a desired signal 224 (shown in dotted lines) and a signal interferer 226. In an implementation, the desired signal 224 may include the information that is received at the receiver frequency ($f_{RX}$) while the signal interferer 226 includes self-generated signal interferer or opportunistic signal interferer. When the calibration mode is activated, the desired signal 224 can be rejected by the receiver component 108. To this end, the signal interferer 226 can be mixed at the mixer component 202 to produce a spectrum at mixer output 228. The spectrum at mixer output 228 can include IM2 products, such as a voltage offset 230 and unwanted signal 232 located at twice of signal interferer 226 frequency (i.e., $2f_{interferer}$). The voltage offset 230 can be detected with high signal to noise ratio because of the absence of the desired signal 224. In certain implementations, the spectrum at mixer output 228 includes the signal interferer 226 multiplied by a gain in the mixer component 202 (i.e., desired output for a given input signal, such as the signal interferer 226).

In certain implementation, the spectrum at mixer component 228 can be filtered to produce a spectrum at filter output 234. The spectrum at filter output 234 can include the voltage offset 230 and a filtered signal interferer 226; however, the unwanted signal 232 can be filtered or suppressed. In an implementation, the voltage offset 230 can create distortions on the desired signal 224. If the power level of the voltage offset 230 cannot be minimized, then the desired signal 224 can be received with a low signal to noise ratio. As discussed above, the voltage offset 230 can be detected with high signal to noise ratio.

Figure 3:
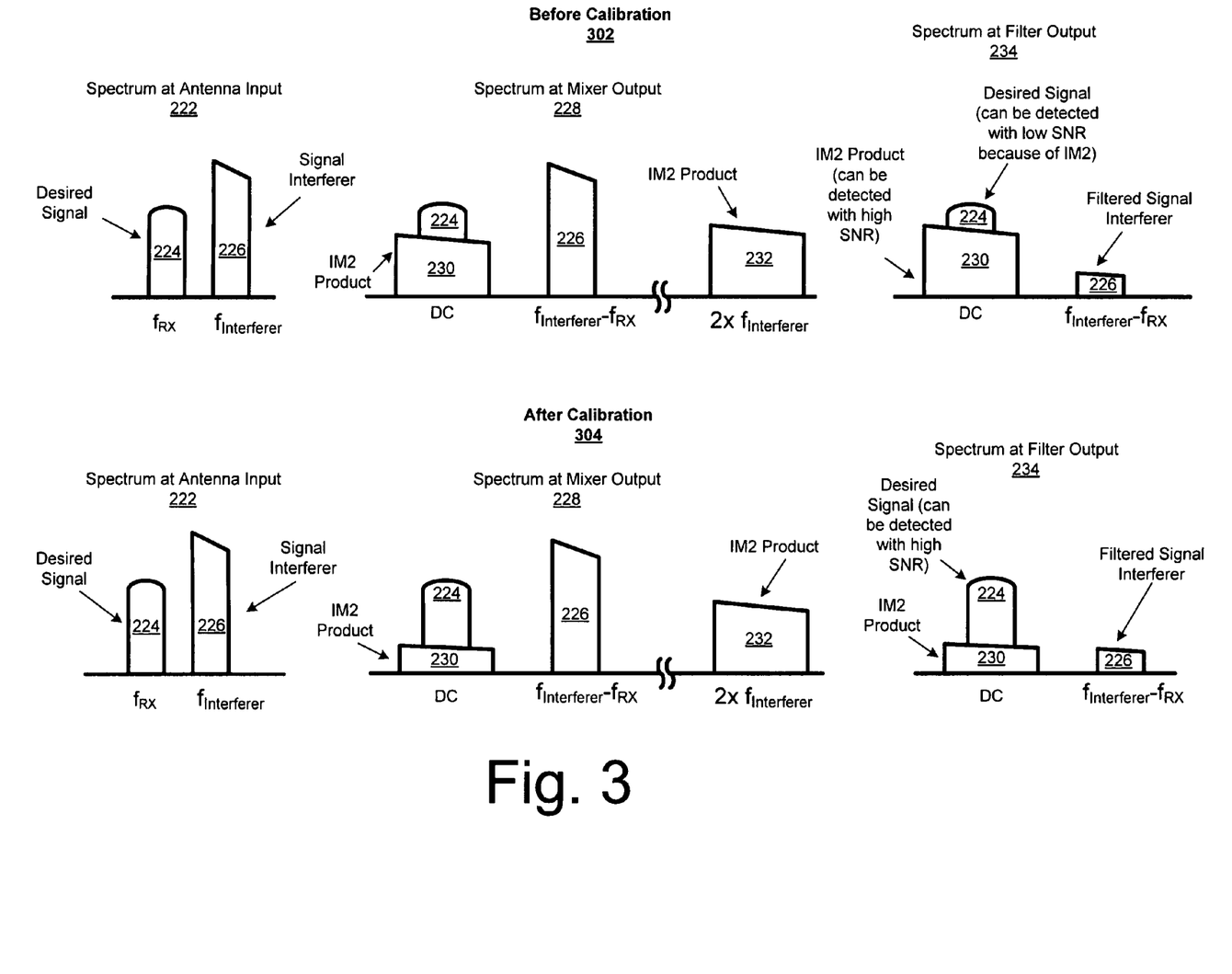
FIG. 3 is an illustration of exemplary signal spectrum before and after calibration.

FIG. 3 is an exemplary illustration of signal components before and after the intercept point calibration in the receiver component 108. In an implementation, before calibration 302 includes the spectrum at antenna input 222, the spectrum at mixer output 228, and the spectrum at filter output 234. As discussed above, the desired signal 224 (i.e., shown in spectrum at filter output 234) can be received with a low signal to noise ratio if the voltage offset 230 cannot be minimized through the intercept point calibration. After the intercept point calibration is performed, after calibration 304 illustrates the desired signal 234 received with a high signal to noise ratio because the IM2 products can be minimized through the dynamic minimization algorithm.

Figure 4:
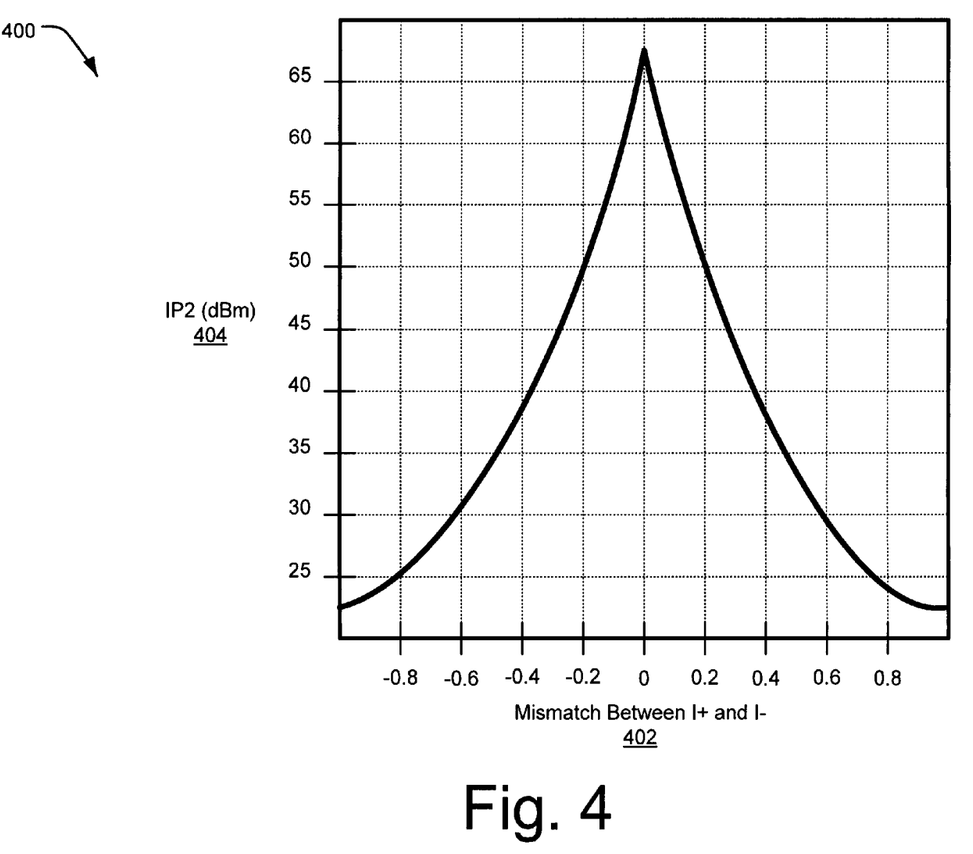
FIG. 4 is an illustration of exemplary current mismatches in a mixer component.

FIG. 4 is an exemplary illustration of a graph 400 showing "mismatch between I+ and I− 402" for x-axis, and IP2 404 (in dBm) for y-axis. In an implementation, the "mismatch between I+ and I− 402" can illustrate positive and negative mismatches in the differential current outputs of the mixer component 202 (i.e., I+ and I−). The mismatches between the differential current outputs are produced by the non-linearity in the mixer component 202. As discussed above, the non-linearity in the mixer component 202 produces the IMD signal components such as the IM2, IM3, etc. For the direct conversion receiver, the intercept point calibration of the mixer component 202 can be directed to the IM2. The intercept point calibration directed to the IM2 can provide the sufficiently high IP2 as shown. For example, a high value (i.e., 67 dBm) for the IP2 404 occurs during a zero mismatch at the mixer component 202. In other implementations, the IP2 404 decreases in value when the "mismatch between I+ and I– 402" deviates from positive to negative values.

Figure 5:
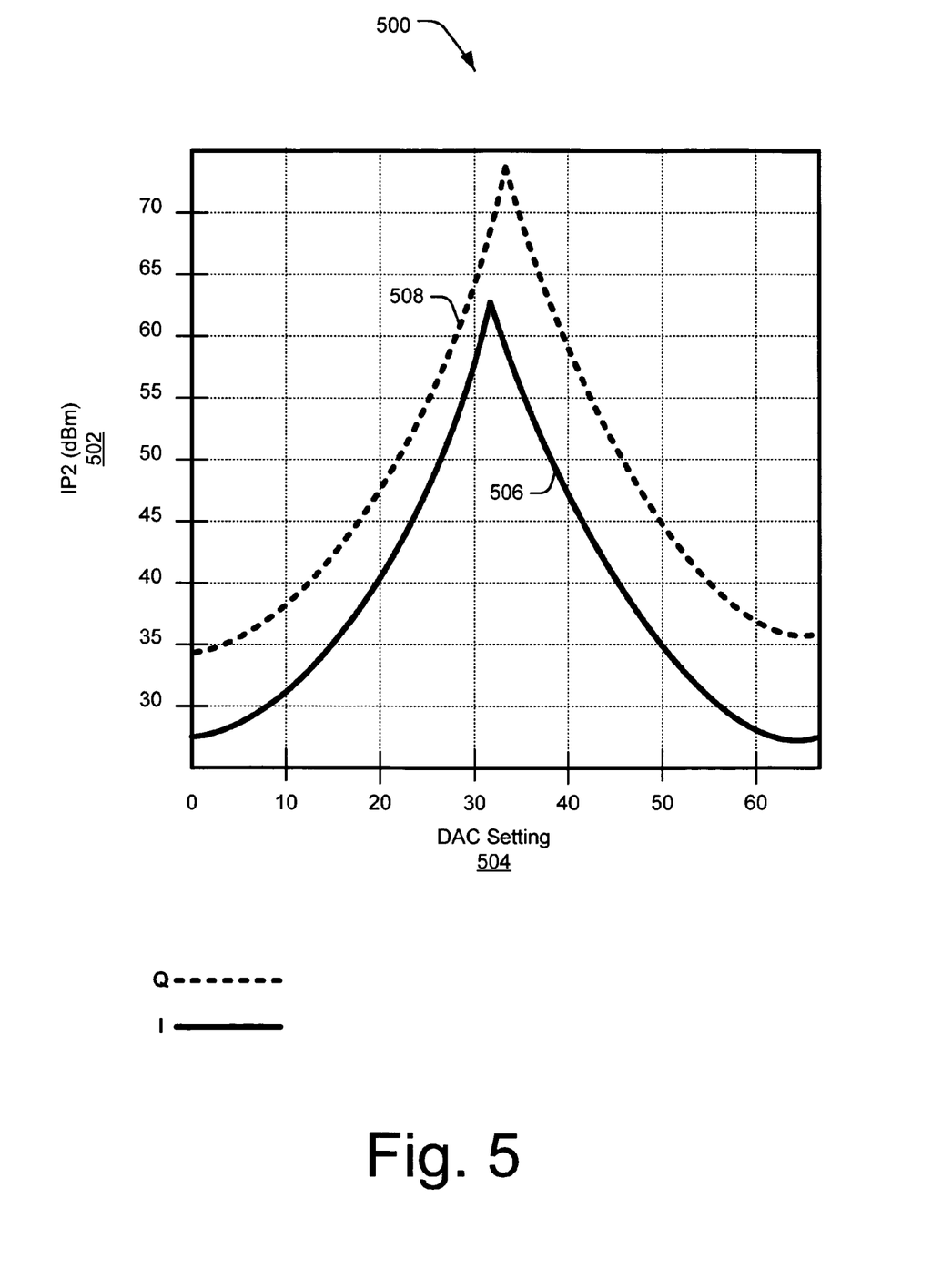
FIG. 5 is an illustration of exemplary digital to analog conversion setting adjustments versus second order intercept point (IP2).

FIG. 5 is an exemplary graph 500 that shows DAC setting adjustment effects for the I and Q channels. As shown in FIG. 5, IP2 502 can vary for a certain amount of DAC setting 504. The DAC setting 504 can include the setting adjustments provided by the dynamic minimization algorithm. The setting adjustments can be converted into the optimized analog setting of the mixer component 202. In an implementation, the IP2 502 and the DAC setting 504 are distinct and separate for the I channel (shown in graph 506) and the Q channel (shown in graph 508). For example, the I channel (i.e., graph 506) includes a high IP2 502 or value of around 63 dBm at a DAC setting 504 amount of "31." On the other hand, the Q channel (i.e., graph 508) includes a certain value of around 74 dBm at a DAC setting 504 amount of "32." The DAC setting 504 amount can include multiple steps for different setting adjustments.

Figure 6:
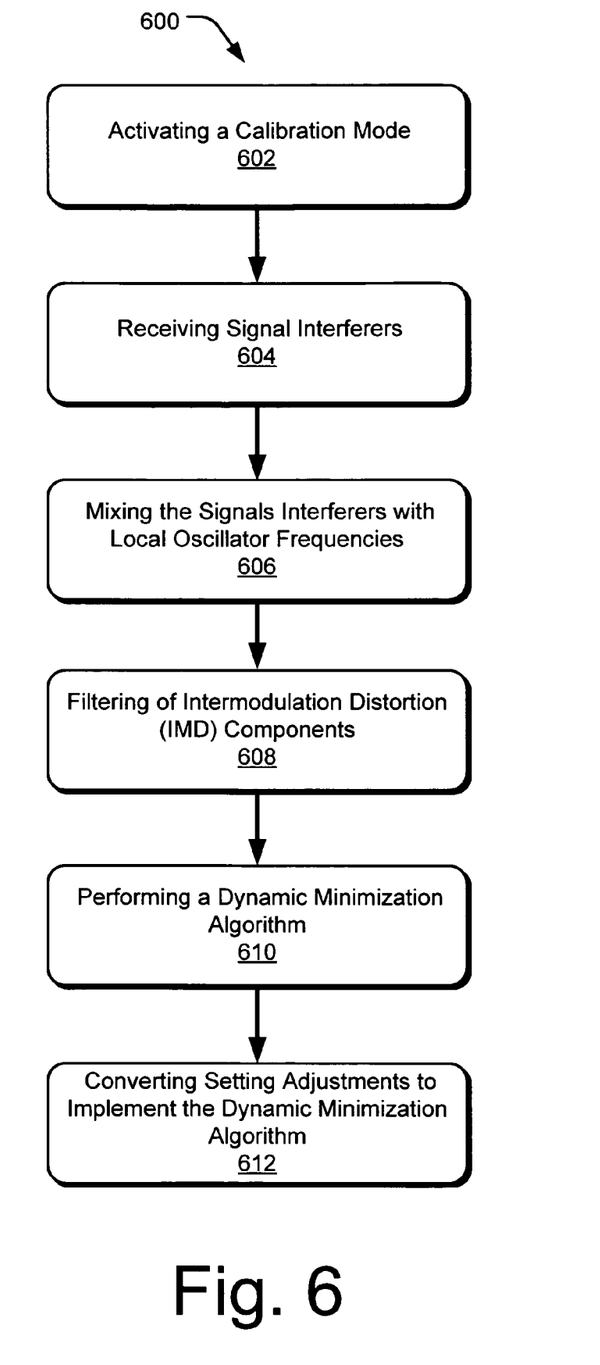
FIG. 6 is a flow chart for calibrating a receiver component of a transceiver device.

FIG. 6 is a flow chart diagram 600 for an exemplary process of calibrating a receiver component 108. The order in which the method is described is not intended to be construed as a limitation, and any number of the described method blocks can be combined in any order to implement the method, or alternate method. Additionally, individual blocks can be deleted from the method without departing from the spirit and scope of the subject matter described herein. Furthermore, the method can be implemented in any suitable hardware, software, firmware, or a combination thereof, without departing from the scope of the invention.

At block 602, activating calibration mode is performed. In an implementation, a processor (e.g., processor/component 110) can enable calibration mode in a receiver component (e.g., receiver component 108). When the calibration mode is enabled, the receiver component is configured to reject desired signals; however, signal interferers can be received by the receiver component 108.

At block 604, receiving signal interferers is performed. In an implementation, the signal interferers can include self-generated signal interferers or opportunistic signal interferers on the air and in surrounding areas (e.g., cellular phone signals, Wi-Fi, Bluetooth, etc.).

At block 606, mixing the signal interferers is performed. In an implementation, the signal interferers include I channel and Q channel that are processed separately. The I channel is mixed with a first local oscillator frequency (e.g., $f_{LO\_RX-I}$) in a first mixer component (e.g., mixer component 202-2) while the Q channel is mixed with a second local oscillator frequency (e.g., $f_{LO\_RX-Q}$) in a second mixer component (e.g., mixer component 202-4). An output of the mixer component 202-2 can produce IMD signal components that include IM2, IM3, etc. for the I channel. Similarly, an output of the mixer component 202-4 can produce the IM2, IM3, etc. for the Q channel. The IMD signal components can be produced by a non-linearity in the receiver component 108. The IMD signal components can be produced at the output of the mixer components 202-3 and 202-4 in addition to a desired output (i.e., signal interferer multiplied by mixer component gain).

At block 608, filtering is performed. In an implementation, the IMD signal components are filtered by a low pass filter (e.g., low pass filter 204) to produce low-frequency components, such as IM2 for the I and Q channels. In certain implementation, the low pass filter 204 provides an output that includes a voltage offset and a filtered desired output.

At block 610, performing a dynamic minimization algorithm is performed. In an implementation, a power level measurement of the IM2 is first performed by an estimator circuit in a mixer bias control component (e.g., mixer bias control component 210). The power level measurement can be used as a reference for the dynamic minimization algorithm. The dynamic minimization algorithm is performed to suppress the IM2 which is prevalent in direct conversion receivers, such as the receiver component 108.

At block 612, converting setting adjustments is performed. In an implementation, the setting adjustment is converted by a DAC component (e.g., DAC component 212) into optimized analog setting of the mixer components 202-2 and 202-4.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as communication devices, computing devices, and other electronic devices.

What is claimed is:

1. A method of intercept point calibration comprising:
activating a calibration mode;
receiving signal interferers, which include self-generated signal interferers or opportunistic signal interferers;
mixing the signal interferers with local oscillator frequencies, producing intermodulation distortion (IMD) signal components;
filtering the IMD signal components, allowing low-frequency components of the IMD signal components to pass through;
performing a dynamic minimization algorithm on a power level of the low-frequency components, providing setting adjustments; and
converting the setting adjustments into an optimized analog setting of mixer components.

2. The method of claim 1, wherein the activating includes rejecting desired signals during the calibration mode.

3. The method of claim 1, wherein the activating is based at least upon sensing of the signal interferers or at a pre-configured time interval.

4. The method of claim 1, wherein the opportunistic signal interferers include existing signals from surrounding areas.

5. The method of claim 1, wherein the IMD signal components are produced by a non-linearity in a receiver component.

6. The method of claim 1, wherein the low-frequency components include a second order intermodulation distortion (IM2).

7. The method of claim 6, wherein the IM2 lands on a desired channel and causes desensitization of a receiver component.

8. The method of claim 1, wherein the setting adjustments include bias adjustments.

9. The method of claim 1, wherein the dynamic minimization algorithm includes an increase in a second order intercept point (IP2) used to characterize linearity of a communication system.

10. The method of claim 1 further comprising measuring the power level of the low-frequency components, wherein the measuring the power level includes a power level of a voltage offset in a second order intermodulation distortion (IM2) product.

11. A receiver device that includes:
a low noise amplifier (LNA) that receives and amplifies signal interferers, wherein the signal interferers include at least self-generated signal interferers or opportunistic signal interferers in surrounding areas;
a mixer component that produces intermodulation distortion (IMD) signal components of the signal interferers;
a low pass filter that allows low-frequency components of the IMD signal components to pass through;
a mixer bias control component configured to perform dynamic minimization algorithm, wherein the dynamic minimization algorithm provides setting adjustments; and
a digital to analog converter that converts the setting adjustments into optimized analog setting of the mixer component.

12. The receiver device of claim 11, wherein the opportunistic signal interferers include existing signals from the air used to calibrate the receiver device.

13. The receiver device of claim 11, wherein the low-frequency components include a second order intermodulation distortion (IM2).

14. The receiver device of claim 11, wherein an increase of a second order intercept point (IP2) is obtained to minimize distortion effects of the IM2.

15. The receiver device of claim 11 further comprising an estimator circuit, wherein the estimator circuit performs power level measurement of the low-frequency components.

16. The receiver device of claim 15, wherein the power level measurement is used as a reference to dynamically tune up the mixer component.

17. A wireless communications system comprising:
a transmitter component; and
a receiver component configured to perform an intercept point calibration, the intercept point calibration comprises a method of
activating a calibration mode;
receiving signal interferers, wherein the signal interferers include at least self-generated signal interferers or opportunistic signal interferers in surrounding areas;
mixing the signal interferers to produce intermodulation distortion (IMD) signal components;
filtering the IMD signal components to produce low-frequency components;
performing a dynamic minimization algorithm on the low-frequency components, wherein the dynamic minimization algorithm provides setting adjustments; and
converting the setting adjustments into optimized analog setting of mixer components.

18. The wireless communications system of claim 17, wherein the low-frequency components include a second order intermodulation distortion (IM2) produced by a nonlinearity in the receiver component.

19. The wireless communications system of claim 17 further comprising a digital to analog converter (DAC) component to control an operating parameter of mixer components.

20. The wireless communications system of claim 19, wherein the operating parameter is controlled to prevent mismatches in differential current outputs of the mixer components.

* * * * *